(12) United States Patent
Konda et al.

(10) Patent No.: US 7,870,448 B2
(45) Date of Patent: Jan. 11, 2011

(54) IN SYSTEM DIAGNOSTICS THROUGH SCAN MATRIX

(75) Inventors: Baalaji Ramamoorthy Konda, Karnataka (IN); Kenneth Pichamuthu, Bangalore (IN); Jayashri Arsikere Basappa, Karnataka (IN); Anil Pothireddy, Hyderabad (IN)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 11/958,468

(22) Filed: Dec. 18, 2007

(65) Prior Publication Data

US 2009/0158105 A1 Jun. 18, 2009

(51) Int. Cl.
*G01R 31/3177* (2006.01)
*G01R 31/40* (2006.01)

(52) U.S. Cl. .................................................. 714/727
(58) Field of Classification Search ................. None
See application file for complete search history.

(56) References Cited

U.S. PATENT DOCUMENTS

| | | | |
|---|---|---|---|
| 4,060,795 A * | 11/1977 | Harumiya et al. | 340/518 |
| 6,018,815 A * | 1/2000 | Baeg | 714/726 |
| 6,681,359 B1 | 1/2004 | Au et al. | |
| 6,829,751 B1 | 12/2004 | Shen et al. | |
| 6,988,232 B2 | 1/2006 | Ricchetti et al. | |
| 7,191,373 B2 | 3/2007 | Wang et al. | |
| 7,437,692 B2 * | 10/2008 | Oberlaender | 716/4 |
| 2003/0023941 A1 * | 1/2003 | Wang et al. | 716/4 |
| 2003/0046608 A1 | 3/2003 | Bartenstein et al. | |
| 2005/0262409 A1 | 11/2005 | Wang et al. | |
| 2006/0069974 A1 * | 3/2006 | Herrmann et al. | 714/727 |

OTHER PUBLICATIONS

"New IC from Intellitech Facilitates Multi-Board Structural Test, FPGA Configuration and in-the-field System Updates", Parallel 1149.1 Test and Parallel 1532 Configuration; http://www.intellitech.com/company/ptcpr.asp; pp. 1 and 2; and Dec. 1, 2003.
Stollon, et al., "Multi-Core Embedded Debug for Structured ASIC Systems", DesignCon 2004, pp. 1-23.

* cited by examiner

*Primary Examiner*—Jeffrey A Gaffin
*Assistant Examiner*—Dipakkumar Gandhi
(74) *Attorney, Agent, or Firm*—Scully, Scott, Murphy & Presser; Roy W. Truelson

(57) ABSTRACT

A method of in system diagnostics through scan matrix, and an integrated circuit chip in which the diagnostics are performed, are disclosed. The integrated circuit chip operable in a plurality of Boundary Scan test modes in which at least a part of the circuitry in the integrated circuit chip is tested, the integrated circuit chip comprises a scan matrix controller and an instruction register. The scan matrix controller is provided for partitioning said circuitry into multiple matrices, each of the matrices having a plurality of scan elements. The instruction register is provided for holding instructions for the scan matrix controller for partitioning the chip into said multiple matrices. The scan matrix controller is further arranged to test each of said matrices according to instructions in the instruction register by applying a test signal to the tested part of the circuitry.

20 Claims, 4 Drawing Sheets

In system Diagnostics through Scan Matrix (IDSM) Macro Block Diagram:

Pin Description:

DDI -->Debug Data Input
PSI Primary scan input
DDO Debug Data Output
PSOn Primary scan output

IN SYSTEM DIAGNOSTICS THROUGH SCAN MATRIX

BACKGROUND OF THE INVENTION

1. Field of the Invention

The present invention, generally, relates to testing integrated circuits and similar devices. More specifically, the invention relates to scan-based testing, debugging and diagnosis of integrated circuits, printed circuit boards, and systems on a chip.

2. Background Art

Scan-based testing is frequently employed during the development and manufacturing of electronic components (e.g., Integrated Circuits (ICs)) and systems (e.g., Printed Circuit Boards (PCBs) and Systems On a Chip (SoC) for detecting and diagnosing defects and for debugging. This test method is commonly referred to as "scan" because the state elements of the circuits are configured to form a serial shift (i.e., scan) register, often called a scan path or scan chain, during a test mode of operation. A scan test typically involves serially shifting data into (scan-in) and out of (scan-out) the scan path(s) of a Unit Under Test (UUT) as a way of applying digital logic values as test stimulus and capturing digital logic values in response to the test stimulus. The responses are normally compared against expected scan out data, and any failure during the data comparison generally indicates detection of a defect in the UUT. Thus, for a digital circuit, the scan test mode provides full controllability and observability of inputs and outputs of combinational logic included in the UUT. This greatly simplifies the test problem and provides for high quality tests with overall reduced costs.

Providing serial scan access enables "visibility" into a UUT for test and debug purposes by providing a way of observing/controlling the circuit states without the need for physical probing. Without scan, internal nodes of the circuit would only be accessible through the physical pins of the UUT. In this case, any testing or debugging of the circuit would require applying complex sequences of operations to provide control/observation of the internal states. A UUT with scan can also be used to access other circuits connected to the UUT, e.g., circuits embedded within the UUT such as embedded memories and cores or other circuits connected externally to the UUT. This approach is often employed to access external memories for the purpose of programming their contents, e.g., programming FLASH memory from the Boundary Scan path of an IC connected to the FLASH memory.

Scan access is typically performed in accordance with the IEEE 1149.1 Standard Test Access Port and Boundary Scan Architecture specification, which is incorporated herein by reference. This standard was developed primarily to solve the problems of PCB testing. The IEEE 1149.1 Standard utilizes a Boundary Scan path to facilitate access to the I/O pins of devices mounted on the PCB. In addition, the IEEE 1149.1 Standard can be used to access scan paths within an IC to facilitate test, debug, and in-system configuration of ICs, PCBs, and systems.

FIG. 1 illustrates the conventional IEEE 1149.1 Boundary Scan Architecture 100. As shown in FIG. 1, an IC compliant with the IEEE 1149.1 Boundary Scan Architecture 100 has four (optionally, five) additional component pins called Test Clock (TCK), Test Mode Select (TMS), Test Data Input (TDI), and Test Data Output (TDO) (and optionally Test Reset (TRSTN)). These dedicated test pins are commonly referred to as the Test Access Port (TAP). Additionally, IEEE 1149.1 compliant ICs implement three scan registers—an Instruction Register (IR) 102 and two standard Data Registers (DRs) called a Bypass Register 104 and a Boundary Scan Register (BSR) 106. FIG. 1 also shows a User DR 108, which the IEEE 1149.1 Standard permits designers to implement to support additional test and debug features in the architecture 100 such as internal scan paths and Built-In Self-Test (BIST).

In the IEEE 1149.1 Standard, the five TAP pins have the following functions:

TCK is an input signal that is provided to synchronize the execution of various test actions, both within the individual IC components and among multiple IC components being accessed through the TAP. TCK is a periodic clock signal, which is generally free running with a constant frequency. However, TCK may be started or stopped, or its frequency may be changed, depending on the application. Most test actions take place on the rising-edge of the TCK pulse but certain actions occur only on the falling-edge of TCK.

TMS is an input pin that is used to control the internal state of a TAP Controller 110 (see FIG. 1). The TAP Controller 110 is a 16-state Finite State Machine (FSM) that provides a standard IEEE 1149.1 protocol for accessing functions within the architecture 100. Certain actions defined by the IEEE 1149.1 Standard are permitted, and can be executed, only in specific TAP Controller states. TMS values are sampled on the rising-edge of TCK.

TRSTN is an input signal that provides asynchronous reset of the TAP Controller 110, which brings it into the Test-Logic-Reset state to allow the IC component to execute its mission function. Regardless of the state of the TCK and TMS inputs, the target TAP Controller enters and remains in the Test-Logic-Reset state as long as TRSTN is at a logic value of 0. Since it is also possible to reset the TAP Controller 110 by setting TMS to the logic 1 value for at least 5 TCK periods, TRSTN has been defined as an optional input signal.

TDI is an input signal that provides serial scan-in data to the device. TDI receives test data from another device's TDO, or from an external test resource such as a scan controller or Automatic Test Equipment (ATE). The logic value of the signal on TDI is sampled on the rising-edge of TCK.

TDO is the serial scan-out from the device. When a device is enabled to scan data, its TDO transmits test data to another device's TDO, or back to the test apparatus. Scan-out values on the TDO output change with the falling-edge of TCK.

The IEEE 1149.1 Standard facilitates connecting the TAP ports of multiple components together to form an IEEE 1149.1 bus, which allows the connected circuits to be accessed with a common TAP protocol. This is typically achieved by connecting the serial data terminals, TDI and TDO, of the individual devices in a daisy chain fashion such that the TDO output from the previous device along the chain is connected to the TDI input of the next device in the chain. Then, by connecting all of the individual TMS, TCK (and optionally TRSTN) signals of the devices in common, an overall TAP bus is formed.

Conventional test procedures may not be adequate in an application environment. For example, the deep submicron technologies are prone to exhibit defects as functional failures, because existing test environments lack in emulation of the application environment. The high density of gates packed in deep submicron technologies require complex fault models to emulate the application environment. The VLSI and ULSI era are not sufficiently equipped in in-system diagnostics and in-system test in the event of functional failure in the application environment. Hence there is a need to address this issue by proposing a method for in-system diagnostics and test in application environment.

SUMMARY OF THE INVENTION

An object of this invention is to provide a method for in-system diagnostics and test in an application environment.

Another object of the present invention is to provide in system diagnostics through scan matrix.

A further object of the invention is to provide a hybrid system architecture that enables interleaved scan and built-in-system tests for regular structural test and diagnostics.

These and other objectives are attained with a method of in system diagnostics through scan matrix, and an integrated circuit chip in which the diagnostics are performed. The integrated circuit chip is operable in a plurality of Boundary Scan test modes in which at least a part of the circuitry in the integrated circuit chip is tested. The integrated circuit chip comprises a scan matrix controller and an instruction register. The scan matrix controller is provided for partitioning said circuitry into multiple matrices, each of the matrices having a plurality of scan elements. The instruction register is provided for holding instructions for the scan matrix controller for partitioning the chip into said multiple matrices. The scan matrix controller is further arranged to test each of said matrices according to instructions in the instruction register by applying a test signal to the tested part of the circuitry.

In the preferred embodiment of the invention, the scan matrix controller has an interleaved ATPG test mode and a debug test mode. In the ATPG mode, one or more of the scan matrices is directly connected to an ATPG tester, and others of the scan matrices are forced into a by-pass mode to provide said one or more of the scan matrices with direct access to the ATPG tester. In the debug test mode, the scan matrix controller loads test vectors on one or more of the scan elements in a selected one of the matrices. Preferably, the scan matrix controller also has a debug observation mode in which one of the scan elements in a selected scan matrix is addressed for shifting data out for analysis of said selected scan matrix. The integrated circuit may also comprise a test data control register that is used to avoid test vector collisions during the debug test mode.

The In System Diagnostics through Scan Matrix (IDSM) of the preferred embodiment of the invention enables debug or test of the predefined scan matrix region in the application environment with minimal test pin interface. The macro based debug mechanism also provides flexibility to control the debug or test features controlled via IEEE 11491 TAP controller interface or any other equivalent proprietary interface or via the minimal number of test interface pins accessible in application environment.

The preferred debug test solution defines a methodology to stitch the scan Elements designed for ATPG, for diagnostics. The IDSM also provides control over the scan matrix region for debug and test. The preferred embodiment of the test control and observation mechanism, described below in detail, defines scan matrix regions across the chip. The scan matrix region provides access to debug and test the functionality in the specific region. The Scan Matrix can be defined for functional regions of the chip, within cores and macros.

In this preferred embodiment of the invention, the functional logic is virtually partitioned into multiple regions controlled by the Scan Matrix Controller (SMC) for test and debug access during manufacturing as well as in-system. The SMC provides access to the virtual partitions for debug and test, and the SMC capabilities are configured based on the virtual functional regions and the complexities involved in the region. For example, the number of clock domains and asynchronous signals involved in the specific region. The SMC elements are inserted across the virtual functional logic boundary to frame the Scan Matrix. The inactive state of the SMC enables application of test vectors defined by other test modes. The IDSM instruction register and SMC placement may be determined based on the early mode placement details and subsequently refined during the full place mode to close timing.

In the preferred implementation of the present invention, the following procedure may be used in a debug flow. First, generate the functional fault database and test vectors to excite the accessible faults; and second, generate the manufacturing test database and test vectors for the design partition. Third, identify the functional failures of the system and relate that to the functional fault dictionary; and fourth, identify the equivalent functional test vectors and manufacturing fault test vectors and exercise them to reach the fault. Fifth, run extensive manufacturing/functional fault test vectors upon requirement; and sixth, identify the fault location and initiate corrective measures.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
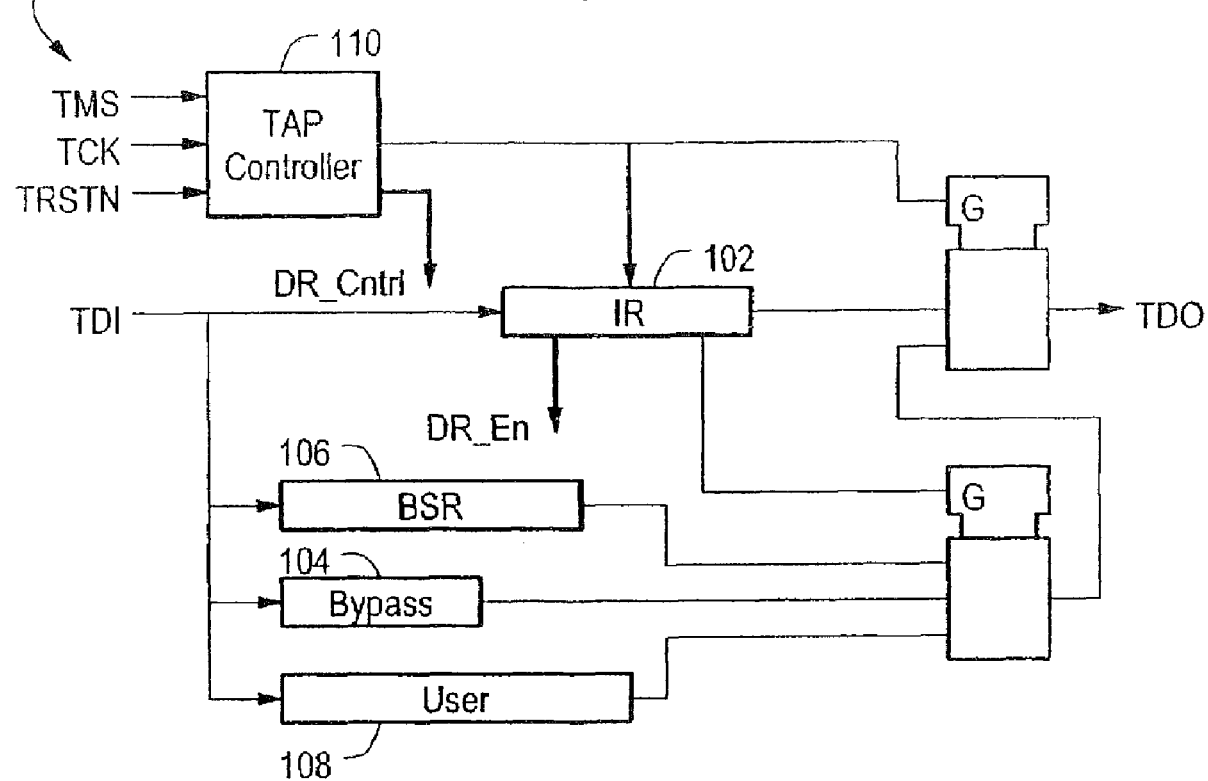
FIG. 1 is a block diagram depicting a convention IEEE 1149.1 Test Access Port (TAP) and Boundary Scan Architecture.
Figure 2:
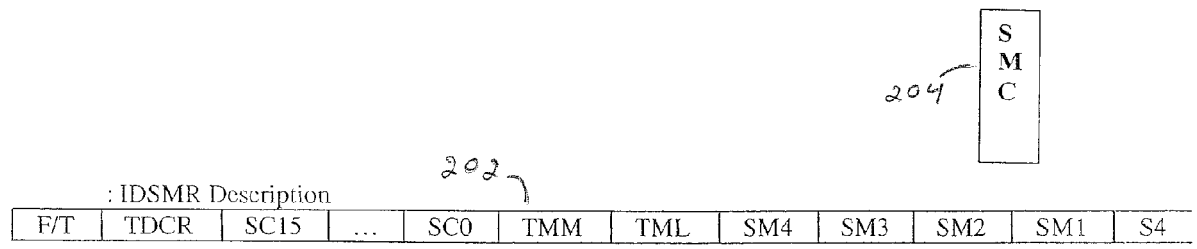
FIG. 2 schematically depicts a preferred embodiment of the In system Diagnostics through Scan Matrix (IDSM) system of the present invention.

With reference to FIG. 2, the preferred embodiment of the In system Diagnostics through Scan Matrix (IDSM) of the present invention comprises an IDSM Instruction register, represented at 202, and a Scan Matrix Controller, represented at 204. The IDSM instruction register carries one-hot encoded instructions to select the required operation supported by IDSM. The number of SMCs determines the length of the IDSM instruction register.

IDSMR

The IDSM instruction register 202 carries different bit fields to control the dynamic operation of IDSM macro along with distributed SMC. FIG. 2 represents an IDSMR for a chip having 4 Scan Matrices, each SM consisting of 16 Scan Elements.

The 32-bit IDSMR classifies separate fields to force the state of the IDSM to perform required operation. The explanation of each bit field is given below.

S1: Represents the RESERVE bit.

S2: Represents the INSYSTEM_DEBUG STATE.

S3: Represents the INSYSTEM_DEBUG TEST STATE.

S4: Represents the ATPG STATE.

SM1-SM4: Address the Scan Matrix.

TMM: Test Mode for SM4 and SM3. 0 represents test mode, 1 represents debug mode.

TML: Test Mode for SM2 and SM1. 0 represents test mode, 1 represents debug mode.

SC0-SC15: Scan element address.

TDCR: Test data Register Select bit. The dynamic register for the next instruction selects this register across DDI and DDO when the current instruction sets this bit, otherwise the scan element addressed by the SC bit will be selected between DDI and DDO.

F/T: This bit is considered only when the TMM or TML bit represents the test mode. When the TMM or TML represents the test mode, the test vector-flipping requirement enables the F/T bit to load the TDCR. F/T 0 represents the completion of test vector load and initiates a capture sequence in the addressed scan elements, which will be observed for debug analysis.

Scan Matrix Controller

Figure 3:
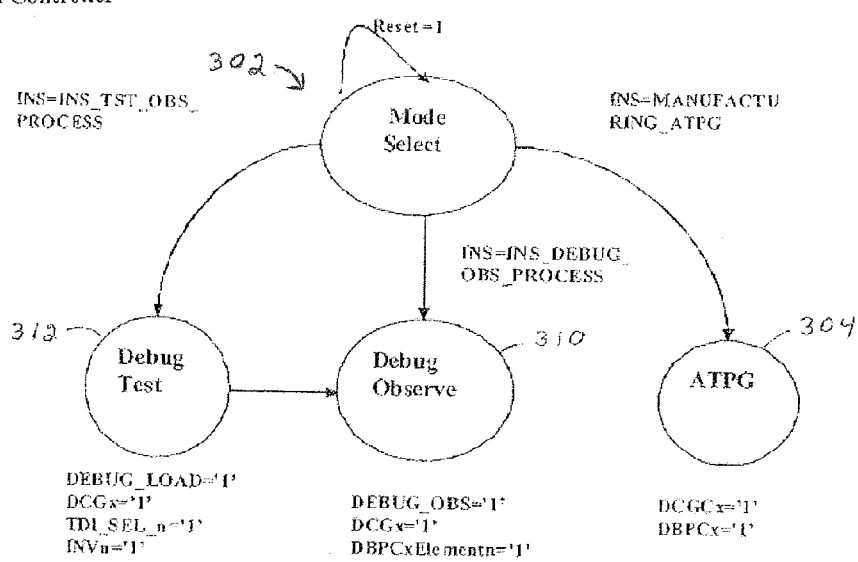
FIG. 3 illustrates the operation of the IDSM controller.

The In System Scan Matrix Controller (SMC) provides easy access to scan matrix elements of logic blocks or cores identified as faulty in the event of functional failure. The faulty data captured at scan matrix elements are shifted to the observation output in the diagnostic process to analyze further as well as to run tests on the selected scan matrix. The parallel debug and test capabilities of the SMC reduce the run time and power consumption during test and accelerates the Turn around Time to Market. With reference to FIG. 3, this macro works on one of the three modes namely DEBUG MODE 302, MANUFACTURING ATPG TEST MODE 304 and BYPASS MODE (not shown).

Debug Mode

The DEBUG MODE is further divided into DEBUG OBSERVATION mode 310 and DEBUG TEST mode 312.

Debug Observation

The DEBUG OBSERVATION mode facilitates:

i) Addressing one of the scan elements in selected scan matrix; which can excite and propagate the fault; and ii) Shifting out the data for analysis and initiate test on selected logic region.

Debug Test

The DEBUG TEST mode facilitates:

i) Addressing one or more of the scan elements in the selected scan matrix;

ii) Loading the test vector on one or multiple scan elements;

iii) Forcing scan elements for selected functional test; and iv) Concatenating adjacent scan matrix element in a predetermined order for advanced debug and test.

Bypass Mode

This mode disables the selected scan matrix. In this mode, the Scan Input of the Scan Matrix bypasses the Scan Matrix elements and directly drives the Scan Out of the Scan Matrix. This effectively isolates the entire scan length which passes via the scan element and connects the addressed matrix scan elements to primary Scan Input and Scan Output pins. Moreover the clocks of the Scan Matrix in this mode shut off to reduce dynamic power.

Manufacturing ATPG Test Mode

This is the default mode of operation when the IDSM is enabled in the chip. The Primary Inputs and Primary Outputs of the chip are connected to the tester and this enables Full chip ATPG TEST.

Interleaved ATPG Test Mode

In this mode, one or more than one Scan Matrix is directly connected to the ATPG tester interface. The geographic location of the scan matrix determines the parallel test and debug feature availed with SMC. The IDSM instruction register determines the Scan Matrix required for INTERLEAVED ATPG access. The SMC cascaded along with selected Scan Matrix are forced into the BYPASS mode to provide access to the tester. The interleaved selective scan matrix ATPG mode reduces the test data volume and reduces the test time with cost effective tester utilization.

Design Implementation

Figure 4:
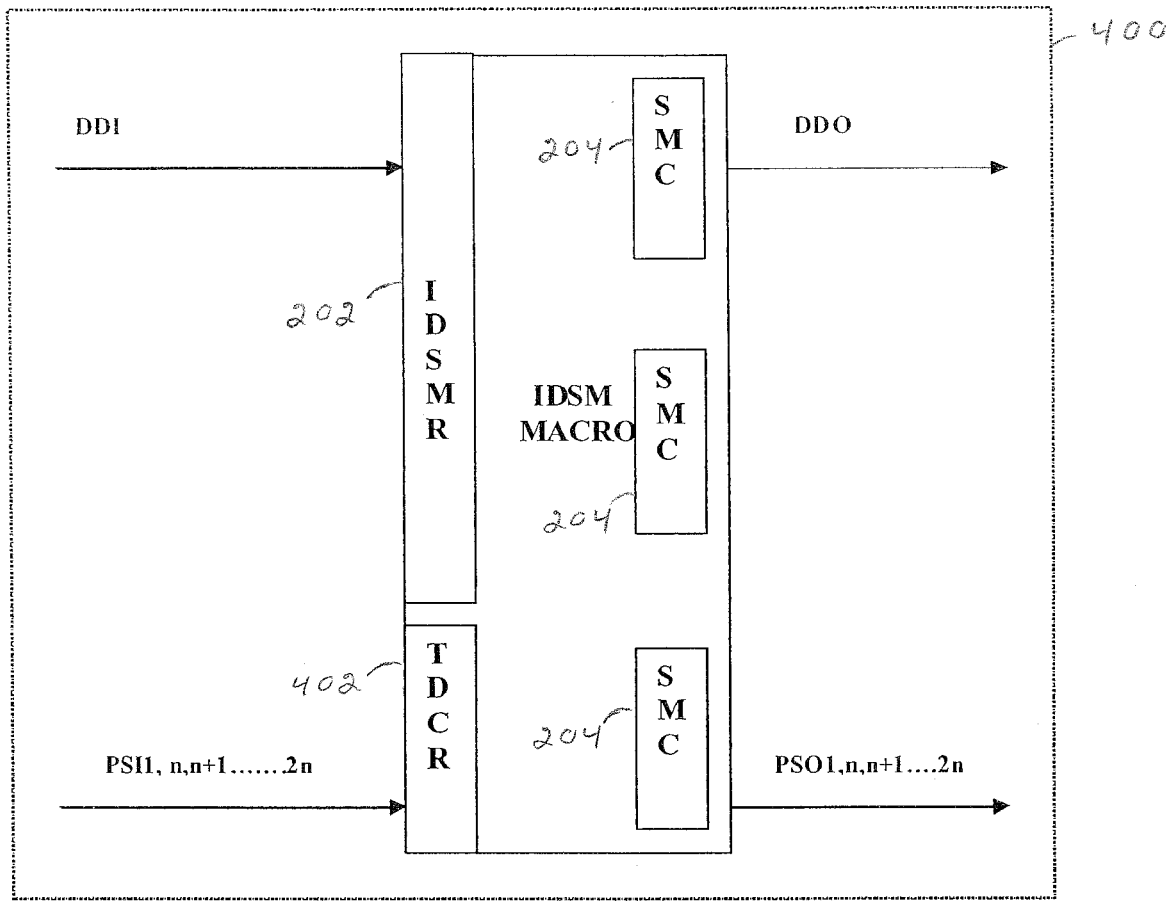
FIG. 4 is a macro block diagram showing the IDSM.

With reference to FIG. 4, the IDSM 400 is comprised of the IDSM Instruction register (IDSMR) 202, the Test Data Control register (TDCR) 402 and the Scan Matrix Controller (SMC) 204. The IDSMR drives the control to run debug or test as per requirement. The TDCR 4002 is utilized during debug test mode to avoid a test vector collision during in system data broadcast mode.

The IDSM 400 defines unique instructions to perform test and debug during manufacturing test mode and in system test debug mode. These instructions can be defined for standard controllers like IEEE 1149.1 TAP. The test or debug specific data are subsequently loaded and observed based on the action requested to the SMC.

The test and debug via the IDSM is triggered by assertion of specific instruction pins on the IDSM macro. The assertion of one hot encoded instruction pins forces the IDSM into a unique state defined to carry out the operation.

The following section elaborates on the instruction set and the description of operation performed in consequence of the instruction.

Instruction Set

The IDSM defines the following instructions to perform test and debug during the in system and manufacturing test modes.

In System Test Mode Instructions:

---

INSYSTEM_DEBUG_OBSERVATION,
INSYSTEM_TEST_OBS_PROCESS,
INSYSTEM_DEBUG_TEST,
INSYSTEM_TEST_OBS_PROCESS,
INSYSTEM_RPCT_TEST,
INSYSTEM_RESTORE.

---

Manufacturing Test Mode Instructions:
MANUFACTURING_ATPG.
Instruction Description:

INSYSTEM_DEBUG_OBSERVATION

This instruction is followed by INSYSTEM_TEST_OBS_PROCESS and INSYSTEM_RESTORE instruction. The assertion INSYSTEM_DEBUG_OBSERVATION instruction via TAP or any other interface moves the IDSM state machine into the DEBUG_OBSERVATION state. The IDSMR fields relevant to this state are shifted via TDI to enable the observation on the selected Scan Matrix. The scan element address forms the linked list for the next observation register and needs to be placed between DDI (Debug Data Input) and DDO (Debug Data Output). Note that the scan clock of selected scan element reduces the switching activity in this state to reduce the dynamic power during observation.

INSYSTEM_DEBUG_TEST:

This instruction is followed by the INSYSTEM_DEBUG_OBSERVATION sequence. The assertion of this instruction enables the loading of the IDSMR to select the scan matrix and number of scan elements that could receive the test mode broadcast data. The INSYSTEM_TEST_OBS_PROCESS broadcasts the DDI in to enabled scan elements. The test vectors are sorted to have maximum hamming distance across the scan elements, so that the scan element that needs bit flipping can be loaded with the INSYSTEM_DEBUG_OBSERVATION sequence. The IDSMR bit-flip/test field determines the functional clock enable state to capture the test result or to load the test sequence in the broadcast mode DDI.

INSYSTEM_TEST_OBS_PROCESS:

This instruction selects the scan element of the scan matrix dynamically addressed by the previous instruction for observation. The linked list pointer of the previous instruction identifies the observation matrix element. The shift length of this register varies as per the scan length of the scan matrix elements.

MANUFACTURING_ATPG:

This instruction allows the SMC to configure scan elements into full chip ATPG or interleaved ATPG as per the number of the Scan Matrix addressed by the IDSMR. The IDSMR Scan Matrix address field configures the full chip manufacturing ATPG mode when all the Scan Matrices are addressed along with this instruction. The INTERLEAVED ATPG on selected Scan Matrices is performed when one or more Scan Matrices are not enabled by the IDSMR field. By default the non-addressed scan matrix is placed in bypass mode to reduce the scan length when interleaved ATPG is performed on an addressed scan matrix.

IDSM Controller DESCRIPTION:

By Default: All clocks are gated; and all Matrices are bypassed.

Mode select: Depending on the Instruction it changes the states accordingly.

Instruction=INSYSTEM_DEBUG_OBSERVATION=>
      State=Debug Observe
    Instruction=INSYSTEM_TEST_OBS_PROCESS=>
      State=Debug Test
    Instruction=MANUFACTURING_ATPG=>State=ATPG Debug Observation State The IDSM does the following action in this state. The functional clocks are stopped on entry into this state, and the test mode pins of the virtual boundary are asserted to frame scan matrix. The scan element for observation is selected based on scan element address with INSYSTEM_DEBUG_OBSERVATION instruction. The shift enable assertion is monitored. (This is decoded from TAP SHIFT_DR state decode signal from TAP controller.) The IDSM moves to test reset state on completion of shift, disables Clock gating of one Matrix, and disables Bypass of one Matrix and of one scan matrix element belonging to this Matrix (DBPCxElementn='1' wherein x represents the Matrix and n represents the required scan Element).

Debug Test State

The following summarizes the sequence of operation when IDSM is in this state. The functional clock are stopped on entry into this state, and the test mode pins of the virtual boundary are asserted to frame scan matrix. The addressed scan elements are enabled for scan operation, and the DDI are arranged across the selected scan elements. Predefined functional clocks are run per test vector to capture the fault, and the IDSM moves to DEBUG OBSERVATION STATE upon completion of capture cycle. The IDSM disables clock gating of one Matrix, sets TDI_SEL_n='1' [of required scan Element. n represents the required scan Element], and sets INVn='1' [of the scan Element where inversion is required wherein n represents the required scan Element].

ATPG State

The ATPG state is entered when the IDSM is asserted with ATPG mode select pin or the TAP instruction is ATPG. This mode is utilized during the manufacturing test. The IDSMR Scan Matrix address bits decide upon the FULL CHIP ATPG or INTERLEAVED ATPG test operation. The non-addressed Scan Matrix is placed in BYPASS mode to connect the addressed scan matrix to primary Scan ports. In this state, all the Scan Matrix are enabled to participate in ATPG and BYPASS is forced on the rest of the Scan Matrix. Control is restored over test ports via SMC to primary ports driven and observed by tester.

Figure 5:
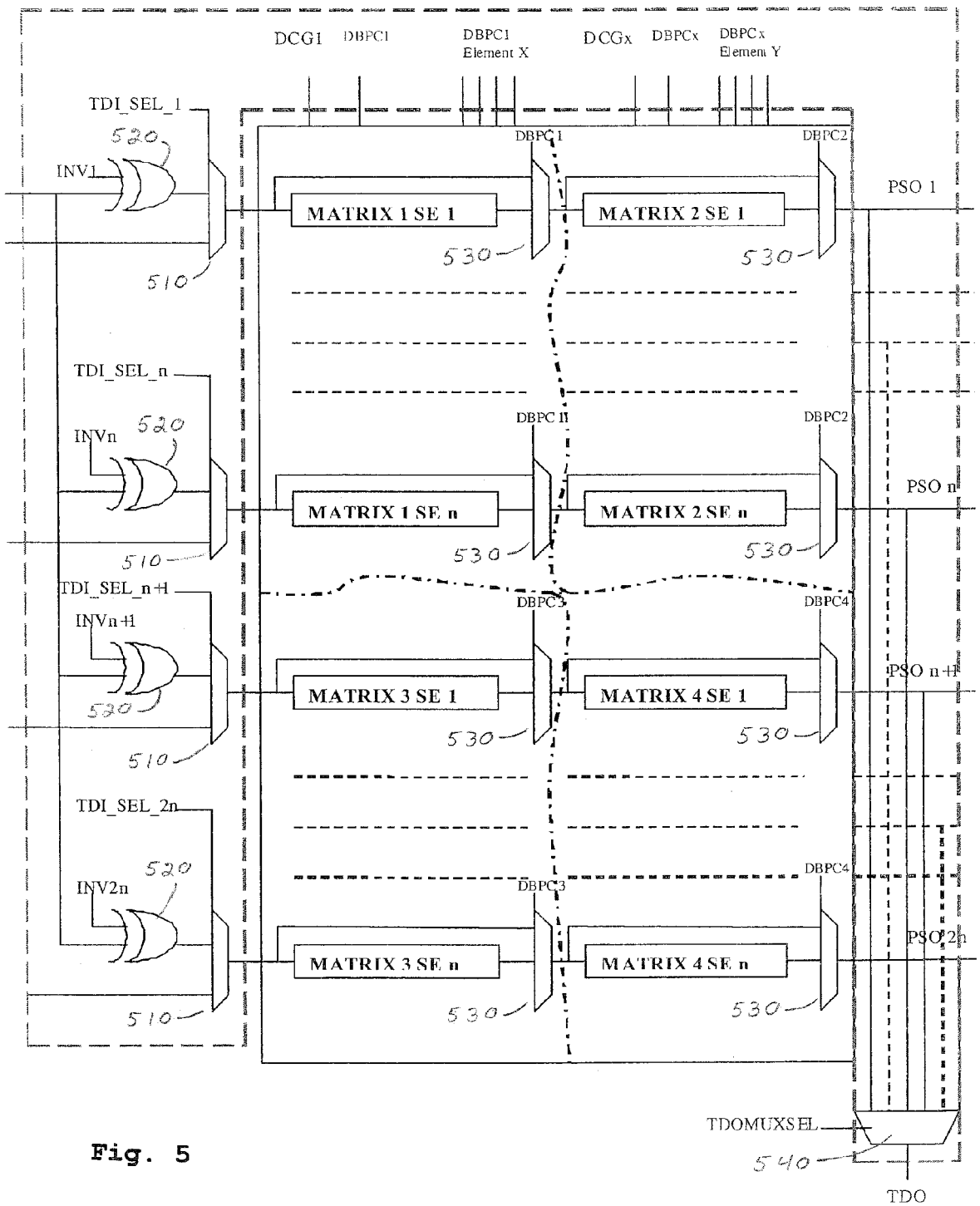
FIG. 5 shows an IDSM implementation with four scan matrices.

As an example of the present invention, the circuit under test in FIG. 5 has been divided into four matrices, with each matrix having elements approximately half as long as the undivided original scan chain that ran from the Primary Scan Input (PSI) to the Primary Scan Output (PSO). The inputs to the scan elements in matrices 1 and 3 are derived from a column of 2:1 multiplexers 510 which, based on the TDI_SEL_x bit either connect the scan element to the primary scan input or to the Test Data Input (TDI), depending on whether it is in the debug mode or the manufacturing test ATPG mode. If more than one scan element is selected at a time in the debug test mode, the data input from the TDI branches out to each of these selected elements (broadcast mode). This raises the possibility of collisions with corresponding bits on selected elements having conflicting values. To overcome this problem, an array of XOR gates 520—one for each primary scan in—is provided to help flip conflicting bits. Since care bits are a small percentage of the total test volume, conflicts could be rare.

Each scan element feeds into a 2:1 multiplexer 530 whose select input is DBPCx. This signal enables bypass of scan elements in a matrix. Matrices not in any of the operational modes can be bypassed using this signal.

In the DEBUG modes, a single scan element can be chosen to connect to Test Data Output (TDO) to scan out values in the element. This is facilitated by the multiplexer 540 controlled by the TDOMUXSEL.

In the DEBUG OBSERVE mode, a selected scan element is connected to TDI and TDO and the contents of the element can be shifted out. In the DEBUG TEST mode, one or more scan elements could be connected to the TDI depending on whether the circuit is in broadcast mode or not. If multiple scan elements are to be observed, they can be observed one after the other by selecting the scan elements through the TDOMUXSEL. In the Manufacturing test ATPG mode, elements in a scan matrix are placed between the PSIs and the PSOs.

The preferred embodiment of the invention may also be used to create a fault dictionary. A fault dictionary is a table that lists, for each test pattern and each fault from some master fault list, how the response of the design with the fault present differs from the response of the fault-free design. The fault dictionary may be generated prior to diagnosing an IC, and is used to compare the observed behavior of the IC with the stored behaviors of the IC with any of the faults listed in the dictionary.

In particular, the preferred embodiment of the invention includes a method of creating a fault Dictionary using Emulators and Hardware module in creating the path coverage test vectors which excite the particular functional elements. If something goes wrong with the particular functionality, we can take the fault dictionary and get those coverage faults.

More specifically, a Functional Fault Dictionary (FFD) may be generated based on the abstract level unit level simulation on the behavior of the system application environment. The creation of FFD process as follows:

Unit Level Leaf Functional Module:

1) The fault behavior is co-related to the functional leaf element of the system on chip at abstract level.

2) Unit level functional set of test vectors are segregated as per functional sequence. This forms the elements of set, which covers 100% path coverage and state reach ability of the module.

3) Correlate the state elements to its scan matrix elements after DFT synthesis based on scan information files.

4) Sort sequence of test vectors for minimal hamming distance and achievable functional coverage across the virtual region of the design.

The preferred embodiment of the invention provides a number of important features. With this embodiment, less run time is needed during diagnosis and manufacturing test due to reduction in the effective scan length, and this embodiment also saves on power during manufacturing test and diagnosis by switching off the matrices that are not targeted. In addition, the preferred embodiment of the invention provides flexibility to configure the IDSM to split the device under test into as many matrices as required and to program the matrix in different modes simultaneously. A unique architecture configuration shares the test logic for both diagnostic and ATPG mode. The broadcast mode debug data input reduces test time, and multiple test access configurations are provided for in system as well as test modes. The multiple virtual functional region access via IDSM reduces the test data volume by number of portions, hence less memory is required for stored pattern test.

The preferred embodiment of the invention enables the use of multiple low cost testers in parallel-interleaved ATPG mode, thereby reducing the test cost. Further, the unique system restore feature during debug observation enables the ability to explore the system function to select one of multiple fix options. Also, the simultaneous interleaved ATPG and debug mode reduces diagnostic run time during manufacturing test.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An integrated circuit chip operable in a plurality of boundary scan test modes in which at least a part of the functional logic circuitry in the integrated circuit chip is tested, the integrated circuit chip comprising:
a scan matrix controller for partitioning said functional logic circuitry into multiple matrices, each of the matrices having a respective plurality of scan elements;
an instruction register holding instructions for the scan matrix controller for partitioning the chip into said multiple matrices; and
wherein the scan matrix controller is further arranged to selectively boundary scan test each of said matrices according to instructions in the instruction register by applying a respective test signal to the tested part of the circuitry.

2. An integrated circuit according to claim 1, wherein the scan matrix controller has an interleaved ATPG test mode, wherein one or more of the scan matrices is directly connected to an ATPG tester, and others of the scan matrices are forced into a by-pass mode to provide said one or more of the scan matrices with direct access to the ATPG tester.

3. An integrated circuit according to claim 1, wherein the scan matrix controller has a debug test mode for loading of test vectors on one or more of the scan elements in a selected one of the matrices.

4. An integrated circuit according to claim 3, further comprising a test data control register to avoid test vector collisions during the debug test mode.

5. An integrated circuit according to claim 1, wherein the scan matrix controller has a debug observation mode for addressing one of the scan elements in a selected scan matrix and for shifting data out for analysis of said selected scan matrix.

6. An integrated circuit according to claim 5, wherein the scan matrix controller has a bypass mode to disable a selected scan matrix.

7. An integrated circuit according to claim 1, wherein the scan matrix controller has a manufacturing ATPG test mode for enabling a full chip ATPG test.

8. An integrated circuit according to claim 1, wherein the instruction register includes an address for each of the scan matrices.

9. An integrated circuit according to claim 1, wherein the scan matrix controller has a plurality of modes, and the instruction register includes a value for determining the mode of the scan matrix controller.

10. An integrated circuit according to claim 1, wherein manufacturer test and debug tests are run in parallel on the scan elements.

11. A method of in-system diagnostics through scan matrix, for use with an integrated circuit chip operable in a plurality of boundary scan test modes in which at least a part of the functional logic circuitry in the integrated circuit ship is tested, the method comprising the steps of:
using an on-chip scan matrix controller to partition the functional logic circuitry in the integrated circuit chip into multiple matrix regions, with each of the matrix regions having a respective plurality of scan elements;

using an on-chip instruction register to hold instructions for the scan matrix controller to partition said chip into said multiple matrix regions;

further using the on-chip scan matrix controller to selectively boundary scan test each of the matrix regions for faults, according to instructions in the instruction register, by applying a respective test signal to the tested part of the circuitry.

12. A method according to claim 11, wherein the scan matrix controller has an interleaved ATPG test mode, wherein one or more of the scan matrices is directly connected to an ATPG tester, and others of the scan matrices are forced into a by-pass mode to provide said one or more of the scan matrices with direct access to the ATPG tester.

13. A method according to claim 11, wherein the scan matrix controller has a debug test mode for loading of test vectors on one or more of the scan elements in a selected one of the matrices.

14. A method according to claim 13, comprising the further step of using an on-chip test data control register to avoid test vector collisions during the debug test mode.

15. A method according to claim 11, wherein the scan matrix controller has a debug observation mode for addressing one of the scan elements in a selected scan matrix and for shifting data out for analysis of said selected scan matrix.

16. An article of manufacture, for use with an integrated circuit chip operable in a plurality of boundary scan test modes in which at least a part of the functional logic circuitry in the integrated circuit ship is tested, the article of manufacture comprising:

at least one computer usable medium having computer readable program code to execute a machine instruction in a processing unit, said computer readable program code executable by the processing unit to perform method steps for in-system diagnostics through scan matrix, said method steps comprising:

using an on-chip scan matrix controller to partition the functional logic circuitry in the integrated circuit chip into multiple matrix regions, with each of the matrix regions having a plurality of scan elements;

using an on-chip instruction register to hold instructions for the scan matrix controller to partition said chip into said multiple matrix regions; and further using the on-chip scan matrix controller to selectively boundary scan test each of the matrix regions for faults, according to instructions in the instruction register, by applying a respective signal to the tested part of the circuitry.

17. An article of manufacture according to claim 16, wherein the scan matrix controller has an interleaved ATPG test mode, wherein one or more of the scan matrices is directly connected to an ATPG tester, and others of the scan matrices are forced into a by-pass mode to provide said one or more of the scan matrices with direct access to the ATPG tester.

18. An article of manufacture according to claim 16, wherein the scan matrix controller has a debug test mode for loading of test vectors on one or more of the scan elements in a selected one of the matrices.

19. An article of manufacture according to claim 18, comprising the further step of using an on-chip test data control register to avoid test vector collisions during the debug test mode.

20. An article of manufacture according to claim 16, wherein the scan matrix controller has a debug observation mode for addressing one of the scan elements in a selected scan matrix and for shifting data out for analysis of said selected scan matrix.

* * * * *